United States Patent [19]

Cotreau

[11] Patent Number: 5,614,867

[45] Date of Patent: Mar. 25, 1997

[54] CURRENT FOLLOWER WITH ZERO INPUT IMPEDANCE

[75] Inventor: Gerald M. Cotreau, Melbourne, Fla.

[73] Assignee: Harris Corp., Melbourne, Fla.

[21] Appl. No.: 266,567

[22] Filed: Jun. 28, 1994

[51] Int. Cl.$^6$ ............................................... H03F 3/04
[52] U.S. Cl. ............................................ 330/288; 323/316
[58] Field of Search ........................... 330/288; 323/315, 323/316

[56] References Cited

U.S. PATENT DOCUMENTS 4,560,920  12/1985  Okanobu ......................... 330/288 X
4,855,618   8/1989  Brokaw ........................... 323/315 X
4,857,864   8/1989  Tanaka et al. ......................... 330/288

FOREIGN PATENT DOCUMENTS 235514  11/1985  Japan ................................... 330/288

*Primary Examiner*—James B. Mullins
*Attorney, Agent, or Firm*—Rogers & Killeen

[57] ABSTRACT

A semiconductor current follower and method using a copy of the input current from a current mirror to insure that the input impedance remains a virtual ground for both unidirectional and bidirectional signals.

22 Claims, 2 Drawing Sheets

CURRENT FOLLOWER WITH ZERO INPUT IMPEDANCE

BACKGROUND OF THE INVENTION

The most common way of processing signals is in a voltage mode where the information is contained in the amplitude of the voltage and the amount of current is irrelevant to the information. Voltage followers are well known in which the output voltage follows or equals the input voltage and in which the load of the output circuit is isolated from or separated from the input circuit in order to prevent the current drawn by the output load from affecting the magnitude of the input voltage.

It is also known to process signals in the current mode where the information is contained in the amplitude of the current and the amount of voltage needed to provide that current is irrelevant to the information. A current follower is an exact analogy to the voltage follower where the output current follows or equals the input current and in which the load of the output circuit must be isolated from or separated from the input circuit to prevent the load voltage necessary to provide the desired current from affecting the magnitude of the input current. An ideal current follower has an output current equal to the input current, a zero input impedance so that it has no effect on the input current, and an infinite output impedance.

High output impedance may be implemented by cascode shields, hob cancelling, etc., and accuracy in reproducing the current level may be obtained with Darlingtons, laser trimmed resistors, etc. The obtaining of a small input impedance has been more difficult. Generally, the prior art solution has been to use an operational amplifier, which is both large in volume and costly in its implementation, and which results in small but finite errors.

It is accordingly an object of the present invention to obviate the problems of known current followers and to provide a novel method and current follower with a theoretical zero input impedance.

It is another object of the present invention to provide a novel method and current follower which does not require an operational amplifier.

It is still another object of the present invention to provide a novel method and current follower which is readily implemented in an integrated circuit.

These and many other objects of the present invention are attained by use of a current mirror to provide one or more copies of the input current, and by the use of one of those copies to insure a zero input impedance.

Other objects, advantages and novel features of the present invention will become apparent from the claims and from the following detailed description of preferred embodiments of the invention when considered in conjunction with the accompanying drawings.

DESCRIPTION OF PREFERRED EMBODIMENTS

Figure 1:
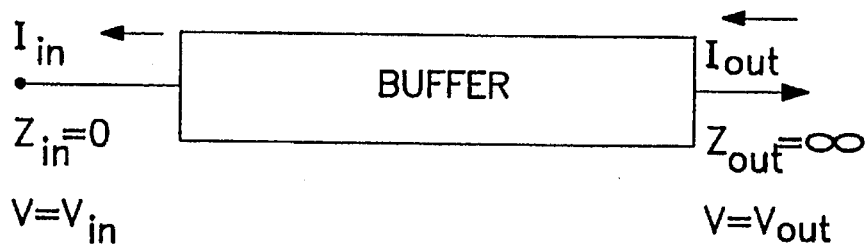
FIG. 1 is functional block diagram of a theoretical current follower.

As shown generally in FIG. 1, a current follower operates in response to an input current Iin to provide an output current Iout. Because of the buffering between the input and output terminals, the input impedance Zin is zero at the input voltage Vin and the output impedance Zout is infinite at the output voltage Vout.

Figure 2:
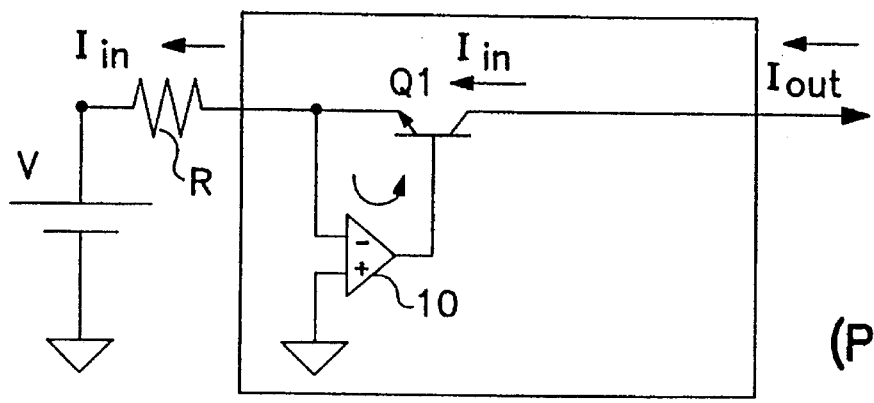
FIG. 2 is a schematic circuit diagram of a known current follower using an operational amplifier.

With reference to FIG. 2, the input current Iin may conveniently be provided by a d.c. voltage V across a resistor R to the emitter of a NPN transistor Q1 the collector of which is used as the output terminal. For a current follower, Iin must equal Iout, and both are the current passing through the emitter-collector path of the transistor Q1.

The input current Iin is also applied to the negative input terminal of a suitable ground referenced conventional operational amplifier 10, and the output of the operational amplifier is connected to the base of the transistor Q1 to control the conduction thereof. The open loop voltage gain of the operational amplifier significantly reduces the input impedance of the circuit by several orders of magnitude but not to zero because of the finite voltage gain. Note that base current errors and transistor collector impedance errors have been ignored in the circuit of FIG. 2 as well as the circuits illustrating the present invention, since they are easily obviated by circuits not here relevant.

Figure 3:
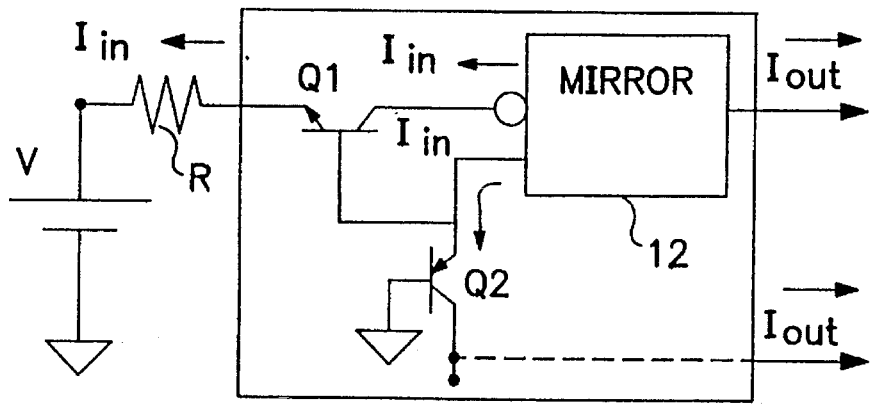
FIG. 3 is a schematic circuit diagram of one embodiment of the present invention providing a current into an output terminal.

In the embodiment of the present invention shown in FIG. 3, the input current Iin may be provided in the manner discussed above to the emitter of the transistor Q1 and the collector is applied to the input terminal of a suitable conventional current mirror 12. A copy of the current Iin is applied to the emitter of a second transistor Q2, the base of which is grounded. The output current Iout of the circuit may be provided by a second copy of the input current from the current mirror 12 or alternatively from the collector of the second transistor Q2.

In operation, the passage of the copy of the current Iin through Q2 results in a voltage drop across the base-emitter PN junction and thus fixes the voltage at the base of the transistor Q1. As the current Iin changes, changing Vbe of Q1, the emitter voltage of Q1 would change if the base voltage were fixed. However, the emitter voltage of Q2 also changes with changes in the input current Iin. Since the change in Vbe of Q2 exactly matches the change in Vbe of Q1, the emitter of Q1 remains constant and independent of Iin.

This may be demonstrated as follows. Defining the Vbe of Q1 at a first current level a as Vbe(1a), the Vbe of Q1 at a second current level b as Vbe(1b), the Vbe of Q2 at a first current level a as Vbe(2a), and the Vbe of Q2 at a second current level b as Vbe(2b), then for the current a:

$$Vb(1) = Veb(2a) \tag{1}$$

where Vb(1) is the base voltage of Q1, and $$Ve(1)=Vb(1)-Vbe(1a)=Vbe(2a)-Vbe(1a). \qquad (2)$$

where Ve (1) is the emitter voltage of Q1.

At current b,:

$$Vb(1)=Veb(2b) \qquad (3)$$

and $$Ve(1)=Vb(1)-Vbe(1b)=Veb(2b)-Vbe(1b). \qquad (4)$$

Consequently,:

$$\begin{aligned}Ve(b)-Ve(a) &= [Veb(2b) - Vbe(1b)] - [Veb(2a - Vbe(1a)] \qquad (5)\\ &= Veb(2b) - Veb(2a) - Vbe(1b) + Vbe(1a) \qquad (6)\\ &= +VT \ln \frac{Iin(b)}{IS2} - VT \ln \frac{Iin(a)}{IS2} + \qquad (7)\\ &\quad VT \ln \frac{In(a)}{IS1} - VT \frac{\ln(b)}{IS1} \\ &= -VT \ln \frac{Iin(a)}{Iin(b)} + VT \ln \frac{Iin(a)}{Iin(b)} = 0 \qquad (8)\end{aligned}$$

As shown above, there is no change in the emitter voltage Ve of transistor Q1 accompanying a change in the input current Iin, i.e., the input impedance is zero.

Figure 4:
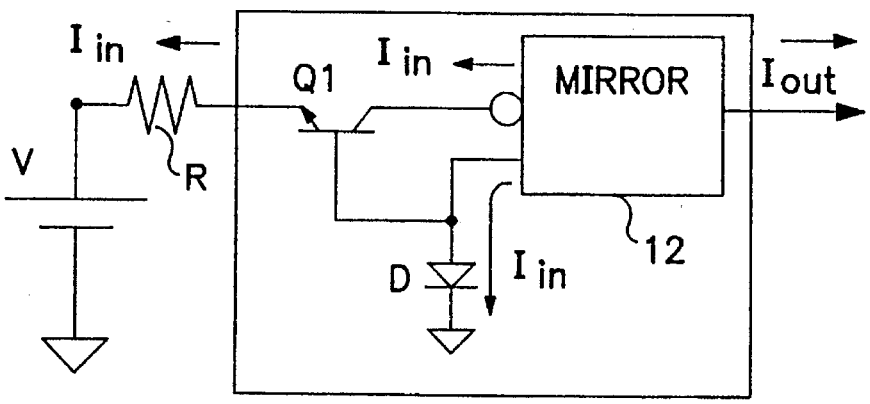
FIG. 4 is a schematic circuit diagram of a second embodiment of the present invention providing a current into an output terminal.

The embodiment shown in FIG. 3 uses the PN junction of the transistor Q2 to establish the base voltage of the transistor Q1. However, and as shown in the embodiment of FIG. 4, the PN junction may be established by a diode D. Where a diode is used, it is necessary to provide a second copy of the input current Iin as the output current Iout.

Figure 5:
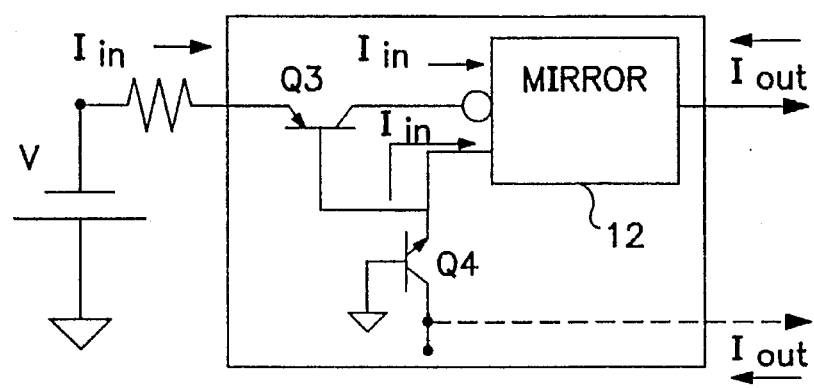
FIG. 5 is a schematic circuit diagram of one embodiment of the present invention providing a current out of an output terminal.
Figure 6:
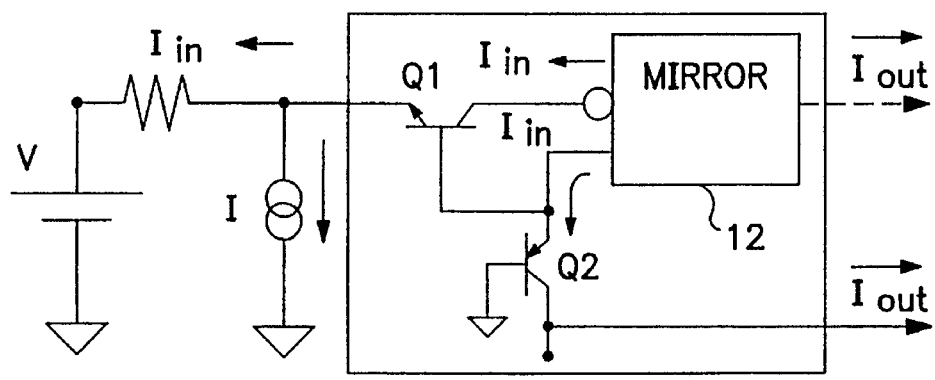
FIG. 6 is a schematic circuit diagram of one embodiment of the present invention operational with a bidirectional current.

The embodiments shown in FIGS. 3 and 4 provide a d.c. or unidirectional output current flowing into the output terminal. As shown in FIG. 5, the output current may be made to flow out of the output terminal by a reversal of the conductivity type of both the input transistors Q3 and the tracking transistor Q4. As indicated, the output current Iout may be a second copy of the input current Iin or the first copy thereof as taken from the collector of the tracking transistor Q4. Where a diode with reversed polarity is used in lieu of Q4, a second copy of the input current must be made as the output current Iout.

Where bidirectional current flow is desired, e.g., an a.c. signal, a bias or carrier current must be provided. As shown in FIG. 6, a suitable conventional d.c. constant current source I may be summed with the input current Iin provided by the d.c. current provided by the application of the voltage V to the resistor R. The polarity of the current must of course be compatible with the conductivity type of the input transistor Q1 and the tracking transistor Q2, and the magnitude of the current sufficient for the operation of the transistors despite the excursions of the input current in the opposite direction. The excursions in both directions may be detected in any suitable conventional manner at the output terminal as a bidirectional or a.c. signal.

All of the foregoing circuits may be implemented with discrete components, but the advantages of implementation by an integrated circuit will be apparent.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A method of providing an output current at one voltage equal to an input current at another voltage in which an input impedance for the input current is zero comprising the steps of:

a) providing an input current at a first voltage;

b) passing the input current through a first transistor;

c) providing a copy of the input current passed through the first transistor;

d) passing the copy of the input current through a PN junction;

e) controlling the base voltage of the first transistor responsively to the current passed through the PN junction and thereby change the junction voltage of the PN junction so that a change in the input current does not cause a change in emitter voltage of the first transistor and thereby providing zero input impedance; and f) providing an output current at a second voltage related to the copy of the input current.

2. The method of claim 1 wherein the step of providing the output current comprises the step of providing a second copy of the input current.

3. The method of claim 1 wherein the step of providing the output current comprises the step of providing the copy of the input current as passed through the PN junction.

4. The method of claim 1 further comprising the step of providing a transistor for the PN junction.

5. The method of claim 1 further comprising the step of providing the PN junction in a diode.

6. The method of claim 1 including the steps of:

g) providing a unidirectional biasing current component for the input current sufficient to make conduction of the first transistor independent of the polarity of the remaining component of the input current; and h) detecting both the polarity and amplitude of the departure of the output current from the biasing current.

7. A method of providing an output current at one voltage equal to an input current at another voltage comprising the steps of:

a) passing an input current at a first voltage to a transistor;

b) passing a copy of the input current passed through the transistor through a PN junction to ground potential to thereby provide a voltage drop across the PN junction;

c) applying the potential across the PN junction to the base of the transistor to thereby control the voltage drop across the transistor and thus equalize the current passing through the transistor and the PN junction; and d) providing an output current at a second voltage related to the copy of the input current passed through the first transistor.

8. A method of providing an output current at one voltage equal to an input current at another voltage comprising the steps of:

a) passing an input current at a first voltage through a first transistor;

b) passing a copy of the input current passed through a second transistor having a grounded base;

c) equalizing the Vbe of the first and second transistors; and d) providing an output current at a second voltage related to the copy of the input current passed through the first transistor.

9. The method of claim 8 wherein the step of providing the output current comprises the step of providing a second copy of the input current.

10. The method of claim 8 wherein the step of providing the output current comprises the step of providing the copy of the input current as passed through the second transistor.

11. A method of providing an output current at one voltage equal to an input current at another voltage comprising the steps of:
   a) passing an input current at a first voltage through a first transistor;
   b) passing a copy of the input current passed through a second transistor having a grounded base;
   c) equalizing the emitter voltage of the first transistor and the base voltage of the second transistor; and
   d) providing an output current at a second voltage related to the copy of the input current passed through the first transistor.

12. The method of claim 11 wherein the step of providing the output current comprises the step of providing a second copy of the input current.

13. The method of claim 11 wherein the step of providing the output current comprises the step of providing the copy of the input current as passed through the second transistor.

14. A circuit for providing at an output terminal an output current at a first voltage equal to an input current at a second voltage applied to an input terminal comprising:
   an input transistor ("IT") having a collector, a base and an emitter;
   a current mirror, the emitter-collector path of IT being connected between said input terminal and the input terminal of said current mirror; and
   a tracking transistor ("TT") having a collector, a base and an emitter, the emitter of TT being connected to said current mirror output terminal and to the base of IT, and the collector of TT being connected to said output terminal.

15. The circuit of claim 14 wherein said IT and said TT are of complementary type.

16. The circuit of claim 14 wherein said IT is a NPN transistor and wherein said TT is a PNP transistor.

17. The circuit of claim 14 including a biasing current source for providing a unidirectional biasing current to said input terminal sufficient to make conduction of said IT independent of the polarity of the input current.

18. A circuit for providing at an output terminal an output current at a first voltage equal to an input current at a second voltage applied to an input terminal in which an input impedance for the input current is zero comprising:
   an input transistor ("IT") having a collector, a base and an emitter;
   a current mirror, the emitter-collector path of IT being connected between said input terminal and an input terminal of said current mirror;
   a PN junction connected to a first output terminal of said current mirror, wherein said PN junction is a portion of a tracking transistor ("TT") having a collector, a base and an emitter,
   the base-emitter path of said TT being connected between ground potential and said first output terminal of said current mirror,
   the emitter of said TT being connected to the base of said IT; and
   a second output terminal of said current mirror being connected to said output terminal.

19. The circuit of claim 18 wherein said IT and said TT are of complementary type.

20. The circuit of claim 18 wherein said IT is a NPN transistor and wherein said TT is a PNP transistor.

21. A circuit for providing an output current at one voltage equal to an input current at another voltage comprising:
   a) a first transistor for receiving an input current at a first voltage;
   b) a second transistor with a grounded base for receiving a copy of the current passed through said first transistor;
   c) means for equalizing the Vbe of the first and second transistors; and
   d) means for providing an output current at a second voltage related to the copy of the current passed through the first transistor.

22. A circuit for providing an output current at one voltage equal to an input current at another voltage comprising:
   a) a first transistor for receiving an input current at a first voltage;
   b) a second transistor having grounded base for receiving a copy of the current passed through said first transistor;
   c) means for equalizing the emitter voltage of the first transistor and the base voltage of the second transistor; and
   d) means for providing an output current at a second voltage related to the copy of the input current passed through the first transistor.

* * * * *